(12) United States Patent
Hong

(10) Patent No.: US 7,572,697 B2  
(45) Date of Patent: Aug. 11, 2009

(54) METHOD OF MANUFACTURING FLASH MEMORY DEVICE

(75) Inventor: Young Ok Hong, Icheon-si (KR)

(73) Assignee: Hynix Semiconductor Inc., Icheon-Si (KR)

( * ) Notice: Subject to any disclaimer, the term of this patent is extended or adjusted under 35 U.S.C. 154(b) by 358 days.

(21) Appl. No.: 11/440,519

(22) Filed: May 25, 2006

(65) Prior Publication Data

US 2007/0004138 A1    Jan. 4, 2007

(30) Foreign Application Priority Data

Jun. 30, 2005    (KR)    ............... 10-2005-0057828

(51) Int. Cl.
*G01L 21/32*    (2006.01)

(52) U.S. Cl. ............... 438/257; 438/262; 438/265; 438/303; 438/305; 438/683; 257/E21.244; 257/E21.625; 257/E21.689; 257/E27.081; 257/E27.103; 257/E29.129; 257/E29.165

(58) Field of Classification Search ............... 438/257, 438/262, 265, 303, 305, 683; 257/315, E29.3, 257/E21.244, 625, 689, E27.081, 103, E29.129, 257/165

See application file for complete search history.

(56) References Cited

U.S. PATENT DOCUMENTS

| | | | |
|---|---|---|---|
| 6,355,524 B1 * | 3/2002 | Tuan et al. ............... | 438/257 |
| 6,417,046 B1 * | 7/2002 | Ho et al. ............... | 438/257 |
| 6,635,532 B2 * | 10/2003 | Song et al. ............... | 438/259 |
| 7,202,174 B1 * | 4/2007 | Jung et al. ............... | 438/694 |
| 7,262,122 B2 * | 8/2007 | Kim ............... | 438/597 |
| 7,268,041 B2 * | 9/2007 | Kim ............... | 438/266 |
| 2005/0045941 A1 * | 3/2005 | Kurita et al. ............... | 257/315 |
| 2006/0110874 A1 * | 5/2006 | Kim ............... | 438/209 |

FOREIGN PATENT DOCUMENTS

| | | |
|---|---|---|
| KR | 2001-0055879 A | 7/2001 |
| KR | 102002003761 | 1/2002 |

\* cited by examiner

*Primary Examiner*—Michael S Lebentritt  
(74) *Attorney, Agent, or Firm*—Marshall, Gerstein & Borun LLP

(57) ABSTRACT

A method of manufacturing flash memory devices wherein, after gate lines are formed, an HDP oxide film having at least the same height as that of a floating gate is formed between the gate lines. Spacers are formed between the remaining spaces using a nitride film. Accordingly, the capacitance between the floating gates can be lowered. After an ion implantation process is performed, spacers can be removed. It is therefore possible to secure contact margin of the device.

6 Claims, 2 Drawing Sheets

METHOD OF MANUFACTURING FLASH MEMORY DEVICE

BACKGROUND

1. Field of the Invention

The invention relates generally to a method of manufacturing a flash memory device and, more particularly, to a method of forming an HDP oxide film of the same height as that of a floating gate between gate lines and then forming gate spacers using a nitride film.

2. Discussion of Related Art

In general, in flash memory devices, if a strong electric field is formed at the edges of the drain region, hot carriers are increased, degrading device characteristics. To prevent the problem, gate spacers made of an insulating material are formed on the sidewalls of the gate line. The gate spacers are used as ion implantation masks during the high-concentration ion implantation process for forming the source/drain region. For higher integration of 70 nm-grade devices, it is preferred that the gate spacers be removed after the high concentration ion implantation process.

FIGS. 1a and 1b are cross-sectional views illustrating a method of manufacturing a flash memory device in the related art.

Referring to FIG. 1a, a tunnel oxide film 11, a first polysilicon layer 12 for a floating gate, a dielectric layer 13 of an ONO structure, a second polysilicon layer 14 for a control gate, and a capping oxide film 15 are sequentially formed on a semiconductor substrate 10 in which an active region and an isolation region are divided by means of common processes.

The capping oxide film 15, the second polysilicon layer 14, the dielectric layer 13, the first polysilicon layer 12, and the tunnel oxide film 11 are sequentially etched by a photolithography process, forming a gate line 16 of a desired pattern. An ion implantation process is then performed to form an ion implantation region 17 that is self-aligned in the gate line 16.

Referring to FIG. 1b, a buffer oxide film 18 is formed on entire surface including the gate line 16. A nitride film 19 for preventing the semiconductor substrate 10 from etch damage in a subsequent etch-back process is then formed.

Thereafter, an oxide film 20 for forming spacers is formed on entire surface including the nitride film 19. An etch-back process is performed so that the oxide film 20 remains only sidewalls of the gate line 16, thereby forming the gate spacers 20.

If the gate spacers are formed using the oxide film as described above, the capacitance of word lines is reduced and a disturb characteristic of cells is improved accordingly. However, the etch-back process cannot be performed by a wet etch method. As a result, there are drawbacks in that the device size increases and the net die reduces since the gate spacers cannot be removed.

In contrast, if the spacers are formed using a nitride film, nitride film spacers remain between floating gate lines. Accordingly, the capacitance of floating gate increases and a disturb characteristic of cells is degraded.

SUMMARY OF THE INVENTION

One embodiment of the invention provides a method of manufacturing a flash memory device, in which after a gate of the flash memory device is formed, an HDP oxide film having the same height as that of a floating gate is formed between gate lines of a memory cell and gate spacers are formed using a nitride film on sidewalls of gate lines of a select transistor, thereby improving a disturb characteristic of the device, removing spacers through a subsequent etch-back process, and reducing the device size.

A method of manufacturing a flash memory device according to one embodiment of the invention includes the steps of forming gate lines on a semiconductor substrate, forming a buffer oxide film over the semiconductor substrate including the gate lines, forming an HDP oxide film having a predetermined height in a cell region between the gate lines, and forming nitride film spacers on exposed sidewalls of the gate lines.

A method of manufacturing a flash memory device according to another embodiment of the invention includes the steps of providing a semiconductor substrate in which gate lines of a select transistor and gate lines of a memory cell are formed, forming a buffer oxide film on the entire structure, forming an HDP oxide film having a predetermined height only in a region between the gate lines of the select transistor and the gate lines of the memory cell and a region between the gate lines of the memory cell, and depositing a nitride film on the entire structure including the gate lines of the select transistor and the gate lines of the memory cell, and causing the nitride film to remain only on sidewalls of the gate lines of the select transistor by an etch process, thereby forming gate spacers.

BRIEF DESCRIPTION OF THE DRAWINGS

A more compete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF EMBODIMENTS

In the following detailed description, only a certain exemplary embodiment of the invention is shown and described simply by way of illustration. As those skilled in the art will realize, the described embodiments may be modified in various different ways, all without departing from the spirit or scope of the invention.

FIGS. 2a to 2d are cross-sectional views illustrating a method of manufacturing a flash memory device according to an embodiment of the invention.

Figure 1A:
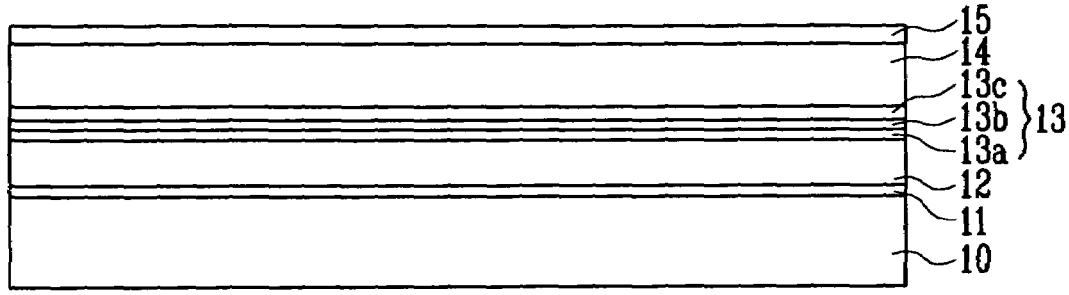
FIGS. 1a and 1b are cross-sectional views illustrating a method of manufacturing a flash memory device in the related art.
Figure 1B:
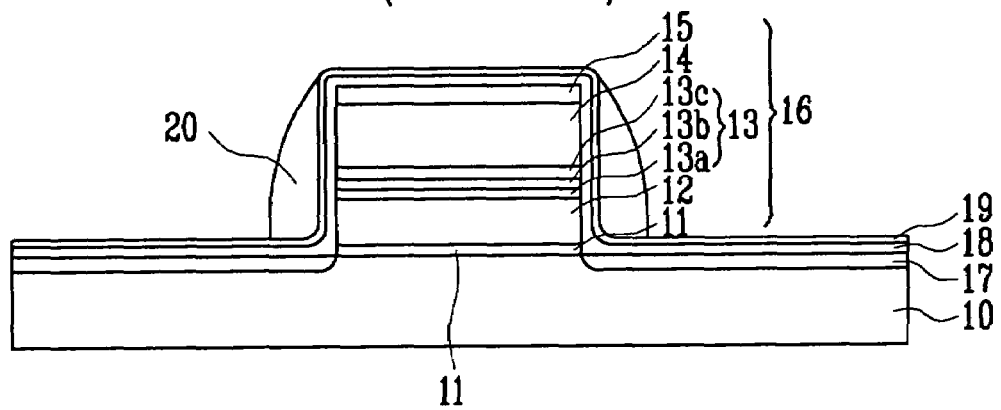
Figure 2A:
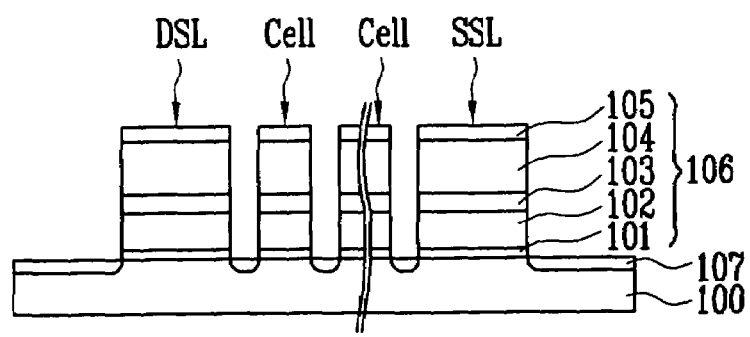
FIGS. 2a to 2d are cross-sectional views illustrating a method of manufacturing a flash memory device according to an embodiment of the invention.

Referring to FIG. 2a, a tunnel oxide film 101, a first polysilicon layer 102 for a floating gate, a dielectric layer 103, a second polysilicon layer 104 for a control gate, and a capping film 105 are sequentially formed on a semiconductor substrate 100 in which an active region and an isolation region are divided by any suitable process. The tunnel oxide film 101, the first polysilicon layer 102, the dielectric layer 103, the second polysilicon layer 104, and the capping film 105 form a gate line 106. The dielectric layer 103 has an ONO structure in which a first oxide film, a nitride film, and a second oxide film are sequentially stacked.

The capping oxide film 105, the second polysilicon layer 104, the dielectric layer 103, the first polysilicon layer 102, and the tunnel oxide film 101 are then sequentially etched by a photolithography process, thus forming gate lines SSL, DSL of a select transistor and gate lines ("Cell") of a memory cell.

Thereafter, an ion implantation process is performed to form an ion implantation region 107.

The floating gate and the control gate may be formed using a variety of suitable modified processes. The invention may also be applied to the floating gate and the control gate formed by the modified processes.

Figure 2B:
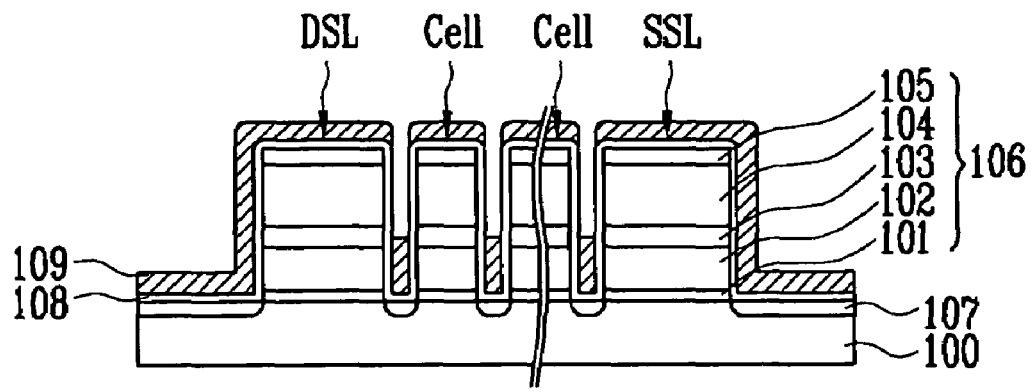

Referring to FIG. 2b, a buffer oxide film 108 is formed on the entire surface including the gate line 106. An HDP oxide film 109 is formed on the entire surface including the buffer oxide film 108. The HDP oxide film 109 may be formed to have a height higher than that of the floating gate 102 between the gate line DSL or SSL of the select transistor and the gate lines Cell of the memory cell. The HDP oxide film 109 may be formed to have a height higher than that of the floating gate 102 between the gate lines ("Cell") of the memory cell.

Figure 2C:
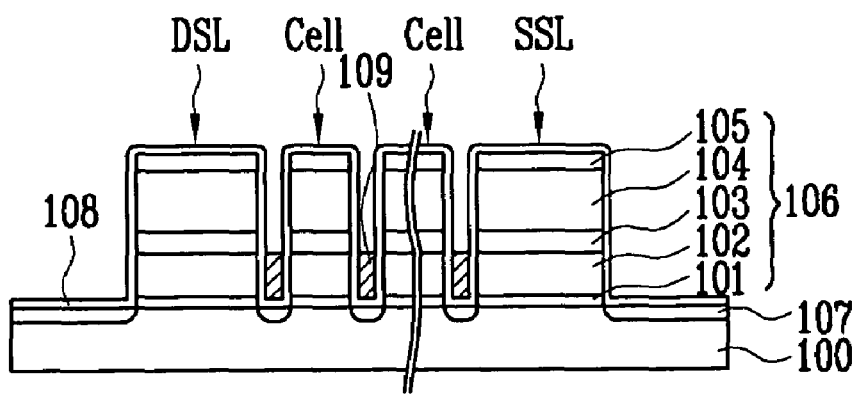

Referring to FIG. 2c, the HDP oxide film 109 is etched by an etch-back process so that, the HDP oxide film 109 remains only between the gate lines 106. The HDP oxide film 109 between the gate lines 106 may remain as high as the height of the floating gate 102.

During the etch-back process, since the distance between the gate lines ("Cell") of the memory cell is narrow, other portions, such as the HDP oxide film between the gate lines of the select transistor, are removed, but the HDP oxide film between the gate lines of the memory cell remains without change.

Figure 2D:
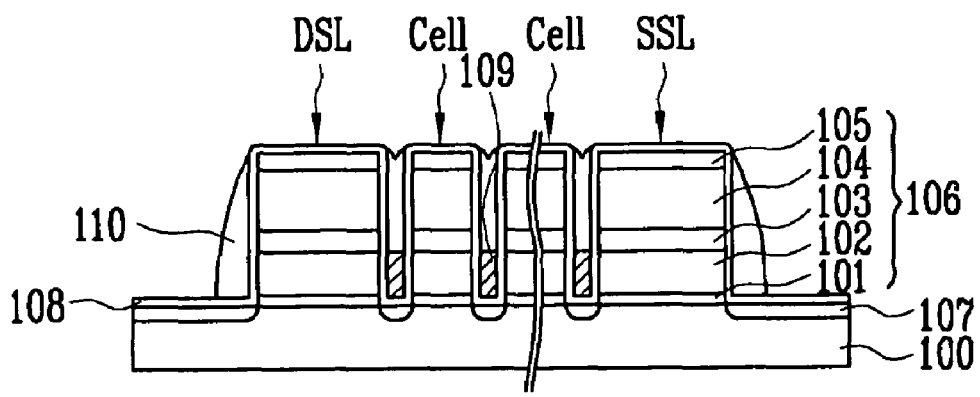

Referring to FIG. 2d, a nitride film 110 is formed on the entire surface including the gate lines 106. Thereafter, an etch process is performed so that the nitride film 110 remains on sidewalls of the select transistor gate lines SSL, DSL, thereby forming gate spacers 110.

The gate spacers 110 are used as ion implantation masks during a high-concentration ion implantation process for forming a source/drain region (not shown). After the high-concentration ion implantation process, the gate spacers 110 are stripped by a wet etch process. It is therefore possible to secure contact margin of the device.

As described above, in the flash memory device according to an embodiment of the invention, the HDP oxide film having the same height as that of the floating gate 102 is formed between the gate lines 106. Accordingly, the capacitance between the floating gates 102 can be lowered. This can be mathematically expressed as follows.

1. In the case where a buffer oxide film, a nitride film, and an oxide film for spacers are formed between floating gates, a total capacitance (Ctotal) between the floating gates can be found as follows by employing buffer oxide film capacitance ($Cox_1$), nitride film capacitance (Cnit), and capacitance ($Cox_2$) of the oxide film for the spacers.

$$\text{Since } 1/Ctotal = 1/Cox_1 + 1/Cnit + 1/Cox_2 \text{ and } Cnit = 1.87\text{Cox\_inter,}$$

$$Cox_1 = Cox_2,$$

$$1/Ctotal = 1/Cox + 1/=1.87\text{Cox\_inter} + 1/Cox =$$

$$2/Cox + 1/=1.87\text{Cox\_inter} = 2 \times 1.87 Cox +$$

$$\text{Cox\_inter})/1.87 Cox \times \text{Cox\_inter})$$

$$\text{Accordingly, } Ctotal = 1.87 Cox \times \text{Cox\_inter})/2 \times 1.87 Cox + \text{Cox\_inter}).$$

$$\text{At this time, if Cox\_inter} \approx Cox,$$

$$Ctotal \approx 1.87 Cox/4.74 = 0.3945 Cox$$

2. In the case where only the buffer oxide film and the HDP oxide film exist between the floating gates, inter-floating gate capacitance (Ctotal) can be found as follows by employing the buffer oxide film capacitance ($Cox_1$) and the HDP oxide film capacitance ($Cox_2$).

$$1/Ctotal = 1/Cox + 1/\text{Cox\_inter} + 1/Cox_2 = 2/Cox + 1/\text{Cox\_inter} =$$

$$2/Cox + \text{Cox\_inter})/(Cox \times \text{Cox\_inter})$$

$$\text{Accordingly, } Ctotal = (Cox \times \text{Cox\_inter})/2/Cox + \text{Cox\_inter}) Ctotal \approx$$

$$Cox/3 = 0.3333 Cox$$

Therefore, the case where only the buffer oxide film and the HDP oxide film are formed between the floating gates has a floating gate capacitance reduction effect of about 15.5% compared with the case where the buffer oxide film, the nitride film, and the oxide film for the spacers are formed between the floating gates.

As described above, according to the invention, after the buffer oxide film is formed, the HDP oxide film having the same height as that of the floating gate is formed between the gate lines. Accordingly, the capacitance of the floating gate can be reduced. Furthermore, since the spacers are formed using the nitride film, the spacers can be removed after a subsequent ion implantation process. It is therefore possible to avoid an increase of device size.

While the invention has been described in connection with practical exemplary embodiments, the invention is not limited to the disclosed embodiments, but, on the contrary, is intended to cover various modifications and equivalent arrangements included within the spirit and scope of the appended claims.

What is claimed is:

1. A method of manufacturing a flash memory device, the method comprising:
   forming gate lines including floating gates on a semiconductor substrate;
   forming a buffer oxide film over the semiconductor substrate including the gate lines;
   forming a high density plasma (HDP) oxide film between the floating gates of the gate lines in a cell region; and
   forming nitride film spacers over the high density plasma (HDP) oxide film between the gate lines.

2. The method of claim 1, wherein the height of the high density plasma (HDP) oxide film is at least as high as the height of the floating gates of the gate lines.

3. The method of claim 1, comprising forming the nitride film spacers by depositing a nitride film on the high density plasma (HDP) oxide film and the buffer oxide film and then etching the nitride film to remain only between the gate lines.

4. A method of manufacturing flash memory device, the method comprising:
   providing a semiconductor substrate in which gate lines of select transistors and gate lines of memory cells including a floating gate are formed;
   forming a buffer oxide film on the surface of the gate lines and the semiconductor substrate;
   forming a high density plasma (HDP) oxide film having a height only in a region between the gate lines of the select transistors and the gate lines of the memory cells and a region between the gate lines of the memory cells; and
   depositing a nitride film on the high density plasma (HDP) oxide film and the buffer oxide film, and etching the nitride film to remain only on sidewalls of the gate lines of the select transistors, thereby forming gate spacers on the high density plasma (HDP) oxide film between the gate lines.

5. The method of claim 4, wherein the height of the high density plasma (HDP) oxide film is at least as high as the height of the floating gates of the gate lines of the memory cells.

6. The method of claim 4, comprising forming the high density plasma (HDP) oxide film by forming the high density plasma (HDP) oxide film on the semiconductor substrate including the buffer oxide film and partially etching the high density plasma (HDP) oxide film by etch-back process so that high density plasma (HDP) oxide film remains only in a region between the gate lines of the select transistors and the gate lines of the memory cells and in a region between the gate lines of the memory cells

* * * * *